(12) United States Patent
Khusnatdinov et al.

(10) Patent No.: US 8,967,992 B2
(45) Date of Patent: Mar. 3, 2015

(54) OPTICALLY ABSORPTIVE MATERIAL FOR ALIGNMENT MARKS

(75) Inventors: Niyaz Khusnatdinov, Round Rock, TX (US); Kosta S. Selinidis, Ausin, TX (US); Joseph Michael Imhof, Austin, TX (US); Dwayne L. LaBrake, Cedar Park, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 216 days.

(21) Appl. No.: 13/455,966

(22) Filed: Apr. 25, 2012

(65) Prior Publication Data

US 2012/0269972 A1 Oct. 25, 2012

Related U.S. Application Data

(60) Provisional application No. 61/478,728, filed on Apr. 25, 2011.

(51) Int. Cl.
*B29C 59/00* (2006.01)
*G03F 7/00* (2006.01)
*G03F 9/00* (2006.01)

(52) U.S. Cl.
CPC .............. *G03F 7/0002* (2013.01); *B29C 59/00* (2013.01); *G03F 9/7042* (2013.01); *G03F 9/7084* (2013.01)
USPC ................ 425/385; 430/5; 428/172; 428/173

(58) Field of Classification Search
CPC .............................. G03F 7/0002; B29C 59/00
USPC .................. 425/385, 169, 174.4, 470; 430/5; 264/119; 101/3.1, 327, 382.1, 450.1, 101/492, 28; 118/100; 428/172, 173
See application file for complete search history.

(56) References Cited

U.S. PATENT DOCUMENTS

| | | |
|---|---|---|
| 6,873,087 B1 | 3/2005 | Choi et al. |
| 6,916,584 B2 | 7/2005 | Sreenivasan et al. |
| 6,932,934 B2 | 8/2005 | Choi et al. |
| 6,936,194 B2 | 8/2005 | Watts |
| 7,070,405 B2 | 7/2006 | Sreenivasan et al. |
| 7,077,992 B2 | 7/2006 | Sreenivasan et al. |
| 7,136,150 B2 | 11/2006 | Sreenivasan et al. |
| 7,157,036 B2 | 1/2007 | Choi et al. |
| 7,179,396 B2 | 2/2007 | Sreenivasan |
| 7,281,921 B2 | 10/2007 | Watts et al. |
| 7,309,225 B2 | 12/2007 | McMackin et al. |
| 7,396,475 B2 | 7/2008 | Sreenivasan |

(Continued)

FOREIGN PATENT DOCUMENTS

JP 2010258326 11/2010

OTHER PUBLICATIONS

Korean Intellectual Property Office, Written Opinion of the International Search Authority for application No. PCT/US2012/035012; Oct. 29, 2012 (13 pgs).

(Continued)

*Primary Examiner* — Laura Edwards
(74) *Attorney, Agent, or Firm* — Cameron A. King (57) ABSTRACT

Imprint lithography templates having alignment marks with highly absorptive material. The alignment marks are insensitive to the effects of liquid spreading and can provide stability and increase contrast to alignment system during liquid imprint filling of template features.

9 Claims, 4 Drawing Sheets

(56) References Cited

U.S. PATENT DOCUMENTS

| | | |
|---|---|---|
| 7,510,388 B2 * | 3/2009 | Terasaki et al. ............ 425/174.4 |
| 7,780,893 B2 | 8/2010 | Sreenivasan et al. |
| 7,837,907 B2 | 11/2010 | Nimmakayala et al. |
| 2004/0065252 A1 | 4/2004 | Sreenivasan et al. |
| 2004/0065976 A1 | 4/2004 | Sreenivasan et al. |
| 2005/0187339 A1 | 8/2005 | Xu et al. |
| 2006/0032437 A1 * | 2/2006 | McMackin et al. ............ 118/100 |
| 2009/0072418 A1 | 3/2009 | Chang et al. |
| 2009/0315223 A1 | 12/2009 | Yoneda et al. |
| 2010/0092599 A1 | 4/2010 | Selinidis et al. |
| 2011/0018168 A1 | 1/2011 | Wuister et al. |
| 2011/0192302 A1 | 8/2011 | Selinidis |

OTHER PUBLICATIONS

Sreenivasan et al. U.S. Appl. No. 11/373,533, filed Mar. 10, 2006, (now abandoned).

* cited by examiner

OPTICALLY ABSORPTIVE MATERIAL FOR ALIGNMENT MARKS

CROSS-REFERENCE TO RELATED APPLICATION

This application claims priority to U.S. application Ser. No. 61/478,728 filed Apr. 25, 2011, which is incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
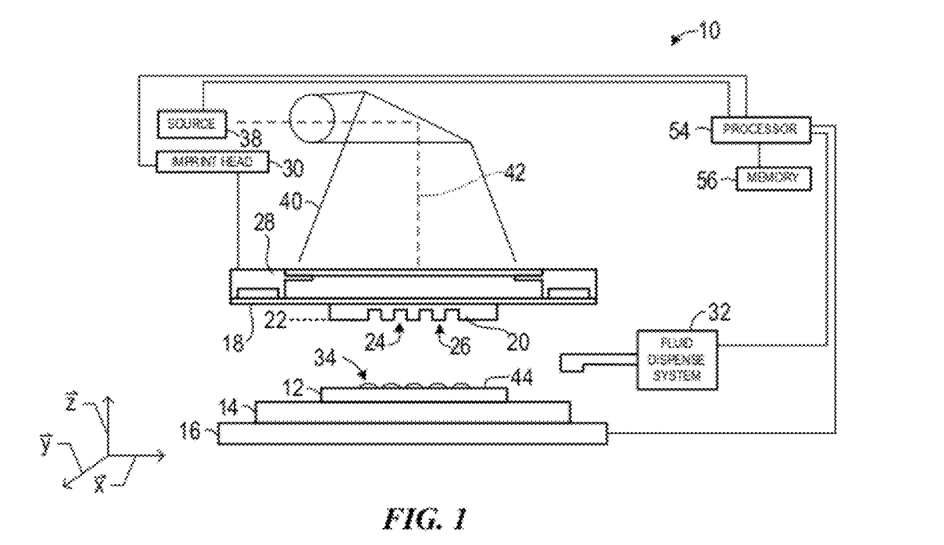
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
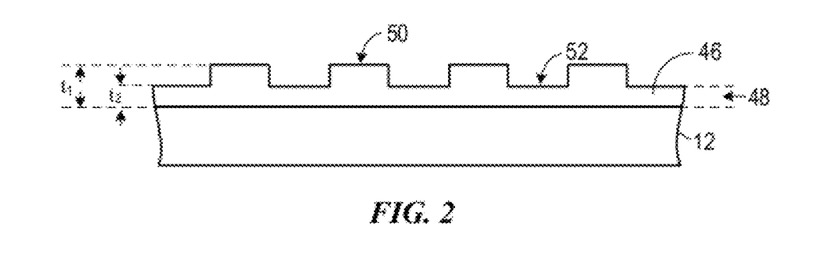
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Alignment marks may aid in aligning template 18 and substrate 12 prior to imprinting formable material 34 in order to facilitate pattern transfer to a precise location on the substrate and correct for any overlay error between template and substrate. Alignment and registration of features across multiple lithography steps is important for overall process success and device fabrication. As feature sizes reach ever smaller dimensions, the demands placed on lithographic placement accuracy become enormous. With particular regard to imprint lithography methods, alignment is further complicated by the mechanical interaction of the template, substrate, and formable material. Exemplary alignment systems and processes that may aid in the facilitation of pattern transfer are further described in U.S. Ser. No. 12/175,258 (issued as U.S. Pat. No. 7,837,907), U.S. Ser. No. 11/695,850 (issued as U.S. Pat. No. 7,780,893), U.S. Ser. No. 11/347,198 (issued as U.S. Pat. No. 7,281,921), U.S. Ser. No. 11/373,533 (abandoned), U.S. Ser. No. 10/670,980 issued as U.S. Pat. No. 7,136,150), U.S. Ser. No. 10/210,894 (issued as U.S. Pat. No. 7,070,405), and U.S. Ser. No. 10/210,780 (issued as U.S. Pat. No. 6,916,584), all of which are hereby incorporated by reference herein in their entirety. Generally, such alignment marks may be etched into e.g. quartz or fused silica, mediums having a substantially similar index of refraction as formable material 34. Thus, when alignment features are fully filled with formable material 34 (whether before or after curing) the optical contrast necessary to resolve alignment features within the visible spectrum no longer exists. That is, the closely matched values of the indices of refraction for the quartz or fused silica templates on the one hand and formable materials (e.g., organic resist materials) on the other hand, result in a lack of visible contrast when the template alignment features are fully filled with formable material during imprinting.

Approaches to isolate alignment marks from the patterned feature area and formable material have been implemented using deeply etched features sometimes referred to as moats. Using such approaches, the alignment marks tend to remain isolated from formable material 34 in order to be visible with typical visible illumination methods. For example, trenches may be used to isolate alignment marks from formable material 34, as further described in U.S. Pat. No. 7,309,225, which is incorporated herein by reference. The minimum amount of space needed for a trench, however, is generally larger than a typical semiconductor scribe area, i.e., the space traditionally allocated for metrology and alignment marks in wafer processing. For example, the width of the trench, plus the minimum distance between alignment marks and edges needed to eliminate fluid-mark interference requires more space than typically allotted for such area. Additionally, the provision of such trenches may result in large open spaces on substrate 12 that may be detrimental to some processes such as chemical-mechanical planarization (CMP), polishing, and/or etching processes wherein uniformity and consistent feature density may be significant attributes. Such trench regions are also prime locations for defectivity. For example, such open areas are more susceptible to contamination, because formable material vapor may deposit and build up over time in these areas.

To alleviate the need for such trenches or large open spaces, alignment marks can be formed of high contrast materials. The high contrast materials (HCM) used to form alignment marks may have different indices of refraction than the formable material 34. As such, these alignment marks may remain visible even in the presence of formable material 34 for aligning processes. Such high contrast alignment marks may be patterned in the same step as the primary patterning features of template 18, and by patterning in the same step, pattern placement errors may be minimized. These alignment marks may be generally etched to substantially the same depth as the primary features formed in substrate 12. U.S. Patent Publication No. 2010/0092599, which is herein incorporated by reference, describes fabrication methods of high contrast marks utilizing single or multiple layers which are patterned during substantially the same step as the main pattern. U.S. Patent Publication No. 2011/0192302, also incorporated herein by reference, describes additional fabrication methods that include single step patterning of alignment marks together with primary features followed by applying a high contrast material as a separate layer. However, the use of such high contrast alignment marks with a high index of refraction may limit throughput in imprint lithography processes as further described herein.

Figures 3A, 3B:
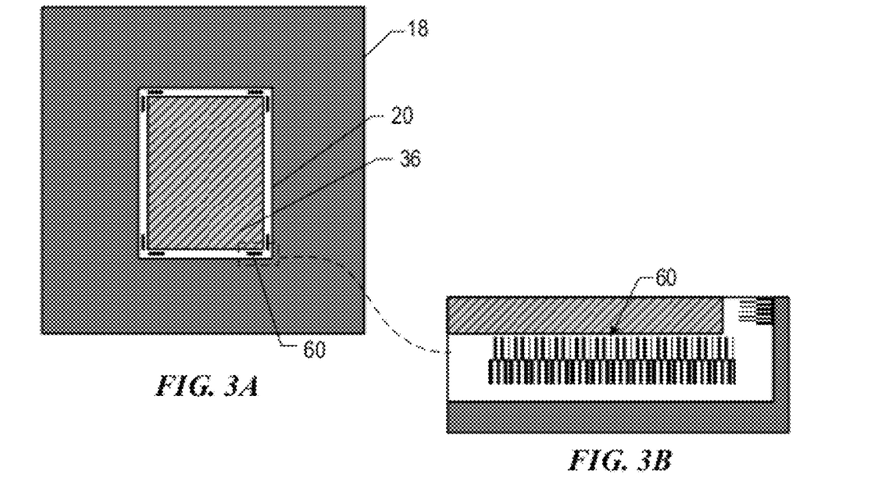
FIG. 3A illustrates a simplified bottom view of a template having pattern features and alignment marks thereon.
FIG. 3B illustrates an enlarged view of an alignment mark illustrated in FIG. 3A.
Figure 4A:
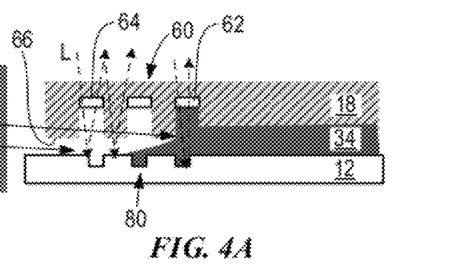
FIG. 4A illustrates a simplified side view of a template and substrate having corresponding alignment marks partially filled with a formable material.
Figure 4B:
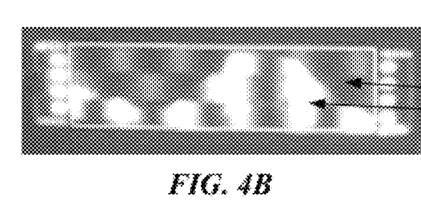
FIG. 4B illustrates an image associated with FIG. 4A.

FIGS. 3A and 3B depicts template 18 having patterned mold 20 with patterned feature area 36 and with alignment marks 60 located peripheral to the corners of patterned feature area 36. As shown in FIG. 4A, alignment mark 60 includes recesses 64 and protrusions 66, with high contrast material 62 having a high index of refraction located in recesses 64. Substrate 12 contains corresponding alignment marks 80 in superimposition with alignment marks 60. As further shown in FIG. 4A, formable material 34 is in the process of spreading and filling recesses 64 of alignment mark 60. FIG. 4B is illustrative of the image and its contrast generated by an alignment mark in the partially filled state of FIG. 4A.

By optical contrast or contrast herein we mean a normalized difference between maximum and minimum intensities in the moiré pattern. Specifically the contrast is defined as:

$$\text{contrast} = (I_{max} - I_{min})/I_{max}$$

Intensity variation along moiré pattern comes from the fact that different areas of align marks on the template such as protuded and recessed parts of the align mark shown of FIG. 4A as dark and light areas, and extruded and depressed parts of the corresponding pattern on substrate give different contribution to the scattered light. Superposition of light from all those scatter areas results in intensity variation along an observed Moiré pattern. Both light amplitude and optical phase difference are important for such superposition.

Figure 4C:
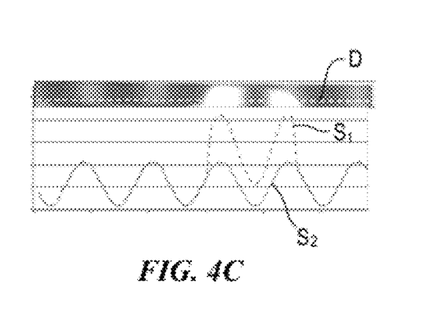
FIG. 4C illustrates a schematic depiction of the contrast signal of FIG. 4B.

As seen, during the transition of filling the alignment mark 60 patterns with formable material 34, the signal is distorted. FIG. 4C further provides a schematic depiction of such signal distortion, showing schematically the intensity distribution (dashed line $S_1$) on the upper moiré strip reproduced from FIG. 4B. The intensity is taken along the dashed white line D that overlaps the image of the moiré pattern in FIG. 4C. A good moiré pattern useful for alignment should generate a signal similar to the solid line $S_2$ in FIG. 4C, and within even maximum and minimum intensities. Filling the alignment mark with polymerizable or formable material (also referred to herein as "liquid resist" or "resist") changes both maximum and minimum intensities (dashed line $S_1$), and as a consequence the contrast. The alignment process must wait until the mark has been completely filled and even and uniform moiré signal is achieved (solid line $S_2$). Some attempts have been made to use signal processing to discern the alignment information during this transitional fill time, but without great reliability. Thus the process of accurate alignment of template 18 with substrate 12 requires waiting until alignment mark 60 has been completely filled with formable material 34, before actual alignment can take place, which in turn impacts throughput in imprint lithography processes. Further, such marks on occasion may only partially fill and thus the image remains distorted thus adversely affecting the alignment altogether.

Figure 5:
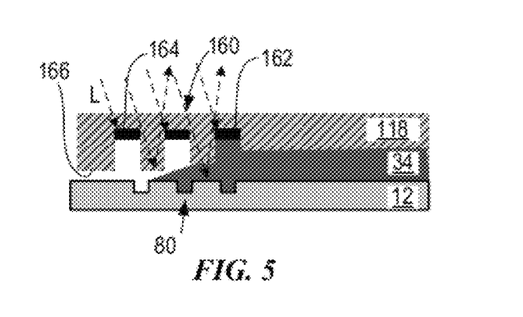
FIG. 5 of the illustrates a simplified side view of a template and substrate having corresponding alignment marks partially filled with a formable material according to an embodiment of the invention.

Described herein are template alignment marks and related processes that utilize highly optically absorptive material (i.e., material with a high extinction coefficient) of a sufficient thickness that significantly reduces the transitional effects of formable material spreading and filling into the alignment mark on the alignment contrast signal. This allows for alignment of the template while the formable material is spreading and filling patterned features and/or the alignment marks themselves, which in turn allows for faster throughput. FIG. 5 depicts an embodiment of such a template alignment mark. Template 118 with alignment mark 160 is positioned spaced-apart from substrate 12. Alignment mark includes recesses 164 and protrusions 166, with highly absorptive material 162 located in recesses 164. In similar fashion, substrate 12 contains corresponding alignment marks 80 in superimposition with alignment mark 160 with formable material 34 partially filling the alignment mark 160 and 180. As further depicted, visible light L striking highly absorptive material 162 is absorbed, but the optical path of light passing and returning between material 162 (i.e., through protrusions 166) is altered only slightly by the presence of resist due to very narrow filling gap. Thus filling does not have a significant impact on the alignment signal.

In some embodiments, the high absorption material can be deposited on top or surfaces of the alignment mark features. Top surface deposition technique however may lead to high residual layer thickness variability. That is, where the top or surface high absorption material layer is deposited only in the align mark area, and pattern feature heights otherwise remain unchanged, there will be variations in residual layer thicknesses of the resultant imprinted pattern, which may be undesirable.

Recessed deposition of the high absorption material has advantages over the top or surface deposition approach because it does not change the feature height and leaves the residual layer thickness unchanged. On another hand, a disadvantage of the recessed deposition can be the reduced replica feature height around align marks. To minimize this disadvantage the total tendency is to reduce thickness of the deposited high absorption material while keeping the signal contrast high.

Figure 6A:
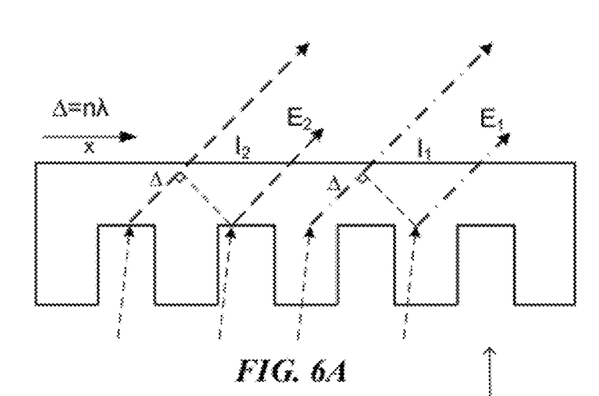
FIGS. 6A-6B illustrate diffraction conditions and electric fields for a simplified alignment mark grating.
Figure 6B:
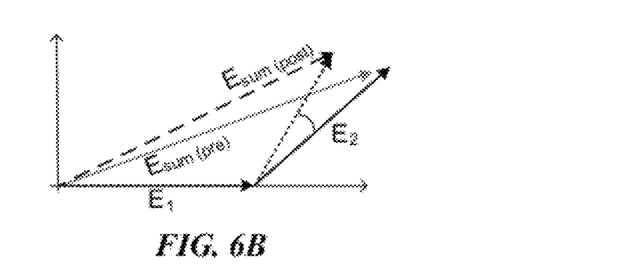

FIGS. 6A-6B illustrates how formable material (i.e. liquid resist) spreading and filling alignment mark features can alter light intensity and impact alignment systems. FIG. 6A depicts a simple diffraction condition for maximum intensity, $I_1(x)$, for a single grating, in the presence of a second superimposed grating that contributes intensity, $I_2(x)$. The resultant light intensity, $I_{sum}(x)$, is not just a sum of intensities, $I_1(x)+I_2(x)$, but rather depends on superposition of electric fields from each individual beam, $E_1(x)$ and $E_2(x)$. The $E_1(x)$ and $E_2(x)$ amplitudes and their phases play significant role for total resulted intensity of light, $I_{sum}(x)$. The intensity of light changes along x because of the period mismatch between imprint mask align grating and substrate align grating. This mismatch is made on purpose in order to create a moiré pattern.

FIG. 6B depicts adding rule for two electric field vectors, $E_1$ and $E_2$, that have different phases. When liquid resist fills the align marks the relative phase of the two vectors will change (shown by the solid to dotted line). This is because the resist has different refractive index than air. The resulted electric field, $E_{sum\ (pre)}$, will change the phase, to $E_{sum\ (post)}$, and more importantly will change in amplitude. The intensity of light is proportional to the square of the electric field amplitude. Thus filling the align marks shown on FIG. 4A with liquid resist (or any other liquid) will locally change the intensity of light fairly dramatically (assuming that the resist does not absorb the light and the light intensity changes only due to internal redistribution of electric fields phases). Thus, while the liquid resist spreads and fills the features in along the alignment mark structure the light intensity will change along its path. Minimum and maximum intensities in the Moiré pattern will change. This also will lead to a change in the signal contrast. Such intensity and contrast change leads to instability of alignment system during the resist spreading, such as previously described and illustrated in FIG. 4C.

Figures 7A, 7B:
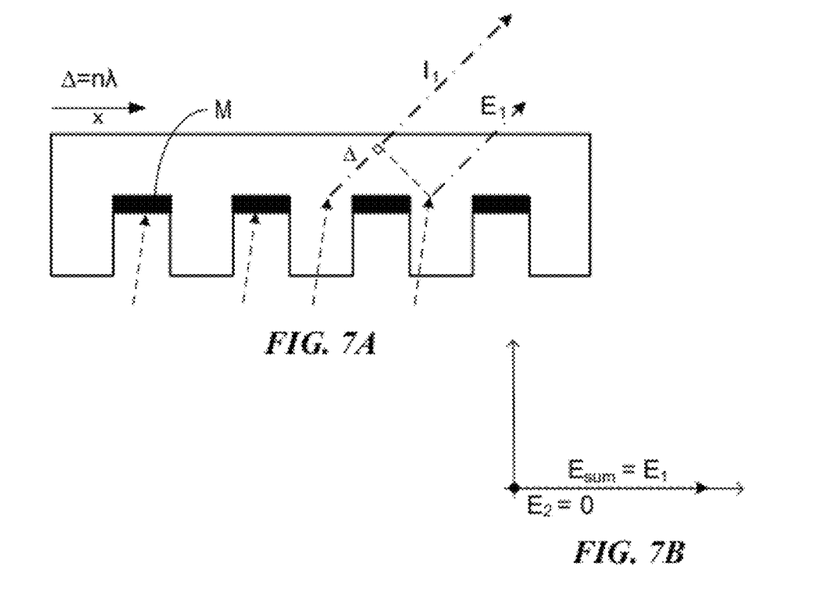
FIGS. 7A-7B illustrate diffraction conditions and electric field for a simplified alignment mark grating according to an embodiment of the invention.

FIGS. 7A and 7B by comparison illustrate the effect of providing highly absorptive material to the grating recesses. FIG. 7A depicts a simple diffraction condition for maximum intensity, $I_1(x)$, for a single grating, but without contributed intensity, $I_2(x)$ from any second superimposed grating. This is due to the effect of absorptive material M located in the recessed grating, i.e., because of the presence of the adsorptive material $E_2$ is completely absorbed. FIG. 7B illustrates the correlating vectors when $E_2=0$ and $E_{sum}=E_1$. When the liquid resist fills in the alignment mark structure the electric field $E_1$ can acquire some phase. But its absolute value remains the same. As a result the intensity of light, $I_{sum}$, will not vary as result of the presence or absence of resist. In other words, here $I_{sum}$ is insensitive to the filling of the align marks with liquid resist. Thus the generated moiré pattern contrast will not change when liquid resist fills the align marks. This insensitivity to liquid filling gives necessary stability to the alignment system.

In summary, in order to achieve independence of alignment mark contrast signal on filling of the alignment mark with resist, highly absorptive material is provided that significantly reduces or completely eliminates one of the electric field components. In case of recessed high absorptive marks (shown schematically in FIG. 7A as compared to FIG. 6A) it significantly reduces or eliminates the electric field $E_2$.

High absorbance of a material is related to a high extinction coefficient. Thus we use high extinction coefficient materials to make the moiré pattern contrast insensitive to liquid filling. In embodiments of the invention, the alignment mark includes highly absorptive material that can absorb 60% or more of light within a specific wavelength range, preferably from 500-800 nm. In further embodiments, the absorption can be 70% or more, 80% or more, or 90% or more. If a white light is used then to the absorption should be meet the desired percentage (e.g., 60% or more) for the associated wavelength range. Another aspect of the material of choice is that it preferably should be transparent enough in the UV light region (below 400 nm) to allow the resist located under the material to fully cure, as many nanoimprint lithography processes routinely uses UV light to cure the liquid resist.

The absorbance of the material of choice at a specific wavelength, $\lambda$, in a simplified form is $$\text{absorption}=1-\exp(-\alpha x)=1-\exp(-4\pi n k x/\lambda)$$

where x is thickness of the material, k is its extinction coefficient, n is refractive index, and $\alpha$ is absorption coefficient. For many practical applications the thickness of the absorptive material of choice is limited by the template feature height (i.e., etch depth of patterned features in the feature area of the template). Where template feature height can be adjusted, then varying a material thickness can be used, to a degree, to vary its absorption. However, particularly where feature height is small (e.g. less than 50 nm) the material selection, and in particular extinction coefficient, will drive absorption performance over thickness. In addition, a thinner layer of material is also preferable in transmitting UV curing light.

Thus, in order to more effectively increase the absorbance, materials with higher product of the extinction coefficient and refractive index can be selected, and as previously described, such materials can be employed to make the moiré pattern contrast insensitive to liquid filling. On another hand increasing the refractive index alone can be counterproductive as the incident light will reflect (scatter) more from such high index interface back. This will increase the scatter light and the minimum intensity of the moiré pattern leading to reduction in the signal contrast. Thus, the extinction coefficient, k, is the more important parameter for the highly absorptive material. That is the most suitable highly absorptive materials will have a high extinction coefficient, k.

In certain embodiments then, a method for achieving highly absorptive material layer while also keeping light scattering to a minimum is to select materials having an extinction coefficient, k, above 2.8, or in certain cases, above 3.3 or higher. Examples of highly absorptive materials useful in the present invention that have such high extinction coefficients in the optical range of 500 nm to 800 nm include, but are not limited to: aluminum, Al; aluminum alloys like $Al_xSi_y$, $Al_xSi_yTi_z$, $Al_xCu_y$, $Al_xCr_y$; rhodium, Rh; chromium, Cr; iridium, Ir; niobium, Nb; titanium, Ti; nickel, Ni; palladium, Pd; platinum, Pt; silver, Ag; gold, Au; copper, Cu; iron, Fe.

Table 1 shows n, k and $\alpha$ values for selected materials useful in the invention. As shown, aluminum has the highest extinction coefficient at around 600 nm (k=7.26) and is particularly well suited for use as highly absorptive material in alignment marks. Rhodium (k=5.34), chromium (k=3.3), and niobium (k=2.87) are also well suited.

TABLE 1 n, k and $\alpha$ values for selected materials at 600 nm

| Material | n (@ 600 nm) | k (@ 600 nm) | $\alpha$, nm$^{-1}$ |
|---|---|---|---|
| Al | 1.2 | 7.26 | 0.091 |
| Rh | 2.073 | 5.368 | 0.117 |
| Cr | 3.194 | 3.3 | 0.110 |
| Nb | 2.896 | 2.87 | 0.087 |
| Ta | 2.007 | 1.878 | 0.039 |

Figure 8:
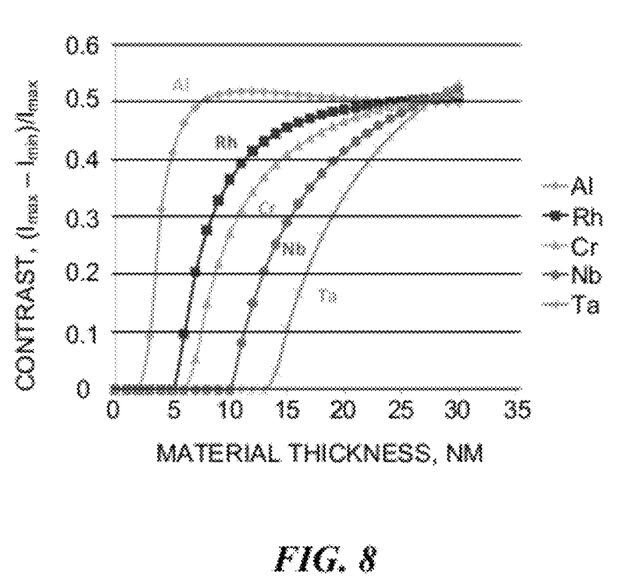
FIG. 8 illustrates contrast levels generated from alignment marks according to embodiments of the invention.

FIG. 8 depicts a graph showing contrast levels for high absorption alignment marks of varying thicknesses made from the materials of Table 1 at a wavelength ranges from 500 nm to 800 nm. These results account for real structure geometry of the alignment mark, wavelength dependence, typical coherence length for a specific LED light source, typical incident and observation angles, and presence of scattered light typically observed experimentally. Aluminum shows highest contrast with minimum thickness in the selected wavelength range (i.e., contrast at least 0.3 at thickness less than 5 nm), with rhodium and aluminum also showing high contrast at minimal thickness (e.g., contrast of at least 0.45 at thickness less than 20 nm (e.g. Cr) or less than 15 nm (e.g. Rh)).

Table 2 below provides a look up table for certain data plotted in the FIG. 8 graph. In particular, Table 2 provides required thicknesses of Al, Rh and Cr in order to achieve specific contrast levels.

TABLE 2

| | Thickness, nm | | |
|---|---|---|---|
| Contrast | Al | Rh | Cr |
| 0.3 | 3.9 | 8.4 | 10.7 |
| 0.4 | 4.9 | 11.3 | 14.5 |
| 0.45 | 5.7 | 14.5 | 18.2 |

Aluminum, the material with the highest extinction coefficient demonstrates highest contrast level at a given thickness. Even though chromium has higher refractive index, $n_{Cr}=3.194$, than aluminum, $n_{Al}=1.2$, and rhodium, $n_{Rh}=2.073$, it demonstrates lower contrast at the given thickness. This confirms the extinction coefficient k is more significant in providing signal contrast than the refractive index n.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An imprint lithography template for patterning formable material positioned on a substrate comprising:
   a body having a first side and a second side;
   a mold having a patterned surface, the mold positioned on the first side of the body, the patterned surface having a feature area defining a first pattern;
   a template alignment mark formed in the patterned surface outside of the feature area, the template alignment mark having a plurality of features that include a highly optically absorptive material having an extinction coefficient k value greater than 2.8 at 600 nm.

2. The template of claim 1 wherein the highly absorptive material absorbs at least 60% of incident light.

3. The template of claim 2 wherein the incident light is from 500 to 800 nm.

4. The template of claim 3 wherein the highly absorptive material transmits ultraviolet (UV) radiation.

5. The template of claim 4 wherein the highly absorptive material has an extinction coefficient k value greater than 3.3 at 600 nm.

6. The template of claim 1 wherein the template alignment mark features include a plurality of recessions with the highly absorptive material located in the recessions.

7. The template of claim 1 wherein the highly absorptive material further comprises aluminum (Al), aluminum alloys including $Al_xSi_y$, $Al_xSi_yTi_z$, $Al_xCu_y$, $AlxCr_y$; rhodium (Rh), chromium (Cr), iridium (Ir), niobium (Nb), titanium (Ti); nickel (Ni), palladium (Pd), platinum (Pt), silver (Ag), gold (Au), copper (Cu), or iron (Fe).

8. The template of claim 1 wherein the highly absorptive material further comprises aluminum (Al), rhodium (Rh), chromium (Cr), or niobium (Nb).

9. The template of claim 1 wherein the highly absorptive material further comprises aluminum (Al).

* * * * *